United States Patent
Shigeta et al.

(10) Patent No.: US 10,295,641 B2
(45) Date of Patent: May 21, 2019

(54) MAGNETIC RESONANCE IMAGING APPARATUS AND METHOD CORRECTING PHASES IN IMAGES CORRESPONDING TO A PLURALITY OF TIME PHASES

(71) Applicant: Toshiba Medical Systems Corporation, Otawara-shi (JP)

(72) Inventors: Takashi Shigeta, Nasushiobara (JP); Yoshimori Kassai, Nasushiobara (JP); Hiroshi Kusahara, Utsunomiya (JP); Yutaka Machii, Nasushiobara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 452 days.

(21) Appl. No.: 15/095,403

(22) Filed: Apr. 11, 2016

(65) Prior Publication Data

US 2016/0299208 A1 Oct. 13, 2016

(30) Foreign Application Priority Data

Apr. 13, 2015 (JP) ................. 2015-082025

(51) Int. Cl.
  *G01R 33/565* (2006.01)
  *G01R 33/561* (2006.01)
  *G01R 33/563* (2006.01)

(52) U.S. Cl.
  CPC ... *G01R 33/56554* (2013.01); *G01R 33/5616* (2013.01); *G01R 33/56308* (2013.01)

(58) Field of Classification Search
  None
  See application file for complete search history.

(56) References Cited

U.S. PATENT DOCUMENTS 4,799,013 A * 1/1989 Hatanaka ............ G01R 33/482
                                                    324/309
5,151,656 A * 9/1992 Maier ............... G01R 33/56554
                                                    324/307

(Continued)

FOREIGN PATENT DOCUMENTS

JP 2002-85376 3/2002
JP 2012-55684 3/2012

OTHER PUBLICATIONS

Chen et al, Single-Shot and Segmented EPI Ghost Artifacts Removal with Two-Dimensional Phase Correction, 2000, Procedding of International Society for Magazine Resonance in Medicine, 8 Edition, p. 1713.*

*Primary Examiner* — Jermele M Hollington
(74) *Attorney, Agent, or Firm* — Oblon, McClelland, Maier & Neustadt, L.L.P.

(57) ABSTRACT

A magnetic resonance imaging apparatus according to one embodiment includes a sequence controller, a correction map generator, an image generator, and a corrector. The sequence controller executes first data acquisition to acquire data for a phase correction map, and second data acquisition to acquire data of a cluster of images corresponding to a plurality of time phases. The correction map generator generates the phase correction map by using echo signals acquired through the first data acquisition. The image generator generates the cluster of images corresponding to the time phases by using echo signals acquired through the second data acquisition. The corrector corrects a phase of each image included in the cluster of images, based on the phase correction map and changes in phase of echo signals that occur between time phases.

14 Claims, 7 Drawing Sheets

(56) References Cited

U.S. PATENT DOCUMENTS

| | | | | |
|---|---|---|---|---|
| 5,565,777 | A | * 10/1996 | Kanayama | G01R 33/465 |
| | | | | 324/309 |
| 6,118,273 | A | * 9/2000 | Takizawa | G01R 33/56554 |
| | | | | 324/309 |
| 6,728,568 | B1 | * 4/2004 | Yatsui | A61B 5/055 |
| | | | | 324/307 |
| 7,772,847 | B2 | 8/2010 | Zur | |
| 2004/0010191 | A1 | * 1/2004 | Yatsui | A61B 5/4872 |
| | | | | 600/410 |
| 2004/0245986 | A1 | * 12/2004 | Kumai | G01R 33/565 |
| | | | | 324/307 |
| 2008/0089570 | A1 | * 4/2008 | Weng | G01R 33/5615 |
| | | | | 382/131 |
| 2011/0234221 | A1 | * 9/2011 | Feiweier | G01R 33/56518 |
| | | | | 324/307 |
| 2012/0146640 | A1 | 6/2012 | Kusahara et al. | |
| 2015/0061668 | A1 | * 3/2015 | Dannels | G01R 33/56554 |
| | | | | 324/309 |
| 2015/0285891 | A1 | * 10/2015 | Dannels | G01R 33/56554 |
| | | | | 324/309 |

* cited by examiner

MAGNETIC RESONANCE IMAGING APPARATUS AND METHOD CORRECTING PHASES IN IMAGES CORRESPONDING TO A PLURALITY OF TIME PHASES

CROSS-REFERENCE TO RELATED APPLICATIONS

This application is based upon and claims the benefit of priority from Japanese Patent Application No. 2015-082025, filed on Apr. 13, 2015; the entire contents f which are incorporated herein by reference.

FIELD

Embodiments described herein relate generally to magnetic resonance imaging apparatus and method.

BACKGROUND

As one example of imaging methods sing a magnetic resonance imaging apparatus, an imaging method such as an echo planar imaging (EPI) method has been conventionally known in which data is acquired with readout gradient magnetic fields of opposite polarities alternately applied. In such an imaging method, an artifact may occur in an image as a result of phase differences among acquired echo signals.

Exemplary methods for preventing such an artifact include a method by which images are corrected with data acquisition for phase correction performed separately from data acquisition for images. In this method, for example, a phase correction map is generated based on phase differences among echo signals acquired in data acquisition for the correction purpose. Images are corrected based on the phase correction map.

DETAILED DESCRIPTION

A magnetic resonance imaging (MRI) apparatus according to one embodiment includes a sequence controller, a correction map generator, an image generator, and a corrector. The sequence controller executes first data acquisition to acquire data for a phase correction map, and second data acquisition to acquire data of a cluster of images corresponding to a plurality of time phases. The correction map generator generates the phase correction map by using echo signals acquired through the first data acquisition. The image generator generates the cluster of images corresponding to the time phases by using echo signals acquired through the second data acquisition. The corrector corrects a phase of each image included in the cluster of images, based on the phase correction map and changes in phase of echo signals that occur between time phases.

Based on the drawings, the following describes embodiments of an MRI apparatus in detail.

First Embodiment

Firstly, a first embodiment described.

Figure 1:
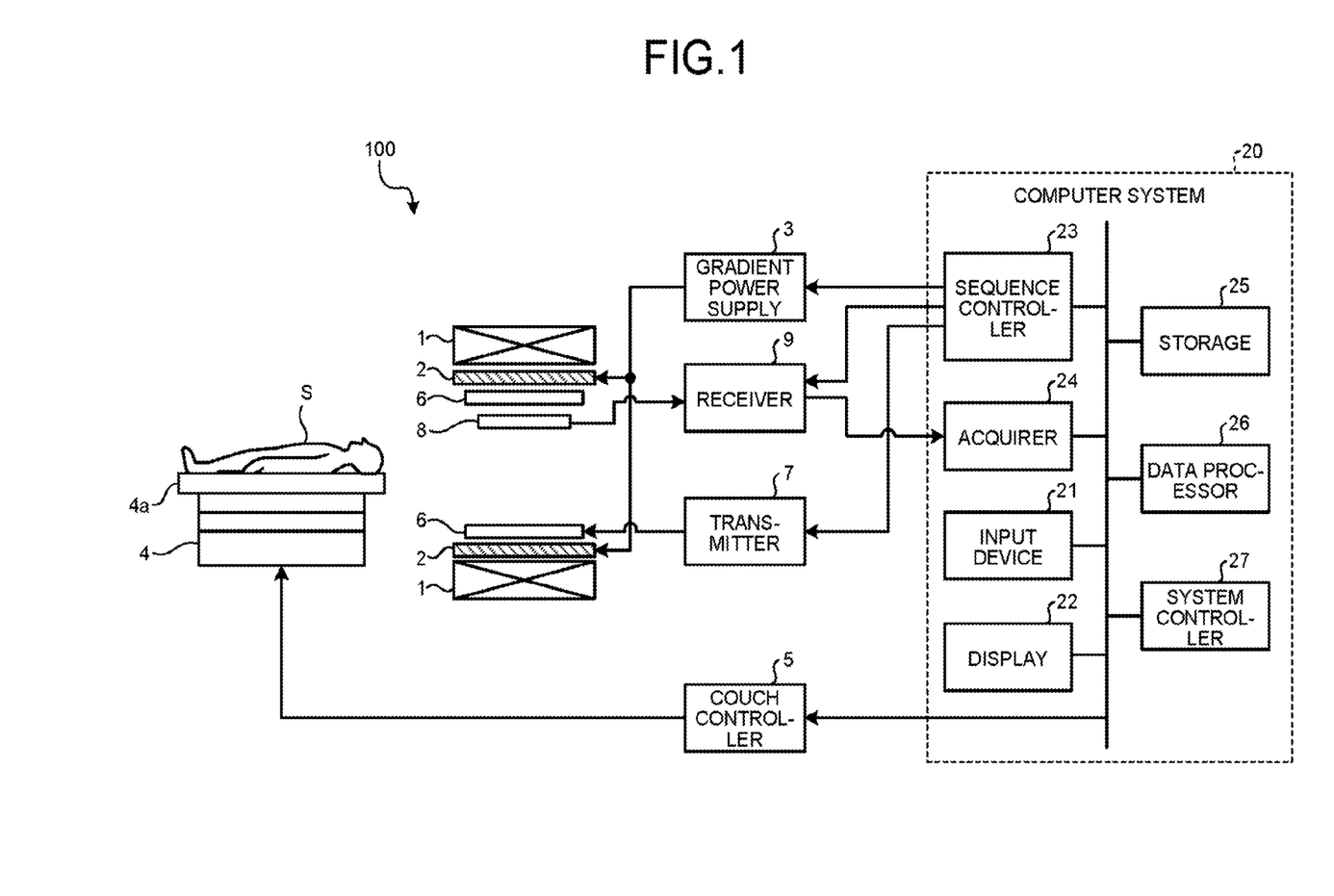
FIG. 1 is a diagram illustrating an exemplary configuration of a magnetic resonance imaging (MRI) apparatus according to a first embodiment.

FIG. 1 is a diagram illustrating an exemplary configuration of an MRI apparatus according to the first embodiment. For example, as illustrated in FIG. 1, an MRI apparatus 100 according to the first embodiment includes magnetostatic field magnet 1, a gradient coil a gradient power supply 3, a couch 4, a couch controller 5, a transmission coil 6, a transmitter 7, a reception coil 8, a receiver 9, and a computer system 20.

The magnetostatic field magnet 1 is formed in a hollow, substantially cylindrical shape (including a shape having an elliptical cross-section in a direction perpendicular to the central axis of the cylinder), and generates a uniform magnetostatic field in an imaging space formed inside thereof. The magnetostatic field magnet 1 is, for example, a permanent magnet, a superconductive magnet, or the like.

The gradient coil is formed in a hollow, substantially cylindrical shape (including a shape having an elliptical cross-section in a direction perpendicular to the central axis of the cylinder), and is arranged to the inner side of the magnetostatic field magnet 1. Specifically, the gradient coil 2 is obtained by combining three coils corresponding to the respective x, y, and z axes that are perpendicular to each other. These three coils generate, with current individually supplied thereto from the gradient power supply 3, gradient magnetic fields the field intensities of which change in directions along the x, y, and z axes, in the imaging space. The z axis is set to the same direction as the magnetic flux of the magnetostatic field.

The gradient power supply 3 supplies power to the gradient coil 2, thereby causing the gradient coil 2 to generate gradient magnetic fields. Specifically, the gradient power supply 3 supplies current individually to the three coils included in the gradient coil 2, and generates gradient magnetic fields in directions along the respective x, y, and z axes as appropriate, so that gradient magnetic fields along the readout direction, a phase encoding direction, and a slice direction that are perpendicular to one another are generated in the imaging space. Hereinafter, a gradient magnetic field along the readout direction, a gradient magnetic field along the phase-encoding direction, and a gradient magnetic field along the slice direction are referred to as a readout gradient magnetic field, a phase-encoding gradient magnetic field, and a slice gradient magnetic field, respectively.

These three directions are used for assigning spatial information to a magnetic resonance (MR) signal. Specifically, the readout gradient magnetic field assigns spatial information in the readout direction to an MR signal by changing the frequency of the MR signal in accordance with a position along the readout direction. The phase-encoding gradient magnetic field assigns spatial information to an MR signal in the phase-encoding direction by changing the phase of the MR signal in accordance with a position along the phase-encoding direction. When a region to be imaged is a lice region, the slice gradient magnetic field is used for determining the direction, the thickness and the number of slices of the slice region. When a region to be imaged is a volume region, the slice gradient magnetic field assigns spatial information to an MR signal in the phase-encoding direction by changing the phase of the MR signal in accordance with a position along the slice direction.

The couch 4 includes a couchtop 4a on which a subject S is placed, and brings the couchtop 4a into an imaging space formed inside the magnetostatic field magnet 1 and the gradient coil 2. For example, the couch 4 is installed so that the longitudinal direction thereof may be parallel to the central axis of the magnetostatic field magnet 1.

The couch controller 5 controls movement of the couch 4. For example, the couch controller 5 controls a drive mechanism provided to the couch 4, thereby moving the couchtop 4a longitudinally, up and down, or right and left.

The transmission coil 6 is formed in a hollow, substantially cylindrical shape (including a shape having an elliptical cross-section in a direction perpendicular to the central axis of the cylinder), and is arranged to the inner side of the gradient coil 2. The transmission coil 6 applies a radio frequency (RF) magnetic field to the imaging space in response to RF pulse current supplied from the transmitter 7.

The transmitter 7 supplies, to the transmission coil 6, RF pulse current corresponding to a Larmor frequency.

The reception coil 8 is mounted on the subject S placed in the imaging space, and receives MR signals, which are emitted from the subject S by the action of the RF magnetic field applied by the transmission coil 6. The reception coil 8 then outputs the received MR signals to the receiver 9. For example, a dedicated coil for each corresponding imaging target region is used as the reception coil 8. Examples of the dedicated coil herein include a reception coil for an abdomen, a reception coil for a head, and a reception coil for a spine.

Based on the MR signals received by the reception coil 9 the receiver 9 generates MR signal data. Specifically, the receiver 9 generates the MR signal data by digitalizing the MR signals, and transmits the generated MR signal data to an acquirer 24.

Although the description herein illustrates an exemplary case in which the transmission coil 6 applies an RF magnetic field and the reception coil 8 receives MR signals, the embodiment is not limited thereto. For example, the transmission coil 6 may further have a reception function by which to receive MR signals, and the reception coil 6 may further have a transmission function by which to apply an RE magnetic field. When the transmission coil 6 has the reception function, the receiver 9 also generates MR signal data from MR signals received by the transmission coil 6. Likewise, when the reception coil 8 has the transmission function, the transmitter 7 also supplies RF pulse current to the reception coil 8.

The computer system 20 controls the entirety of the MRI apparatus 100. For example, the computer system 20 includes an input device 1, a display 22, a sequence controller 23, the acquirer 24, a storage 25, a data processor 6, and a system controller 27.

The input device 21 receives input of various instructions and information of various kinds from an operator. For example, the input device 21 is composed of at least one input device such as a keyboard, a mouse, a trackball, a touch panel, a button, or a switch.

The display 22 displays thereon information of various kinds and various images. For example, the display displays a graphical user interface (GUI) provided for receiving input of various instructions and information of various kinds from an operator. The display 2 also displays, for example, an image generated by the data processor 6. For example, the display 22 is composed of at least one display device such as a liquid crystal monitor, a cathode-ray tube (CRT) monitor, or a touch panel.

The sequence controller 23 executes various kinds of scanning. Specifically, the sequence controller 23 executes various kinds of scanning by, based on sequence execution data transmitted from the system controller 27, driving the gradient power supply 3, the transmitter 7, and the receiver 9. Here, the sequence execution data is information in which a pulse sequence indicating a procedure for acquiring MR signal data is defined. Specifically, the sequence execution data is information in which the following, for example, is defined: at what timing the gradient power supply 3 should supply current to the gradient coil 2; a current intensity to be assigned to the current; at what timing the transmitter 7 should transmit RF pulse current to the transmission coil 6; an intensity to be assigned to the RF pulse current; and at what timing the receiver 9 should detect MR signals.

The acquirer 24 acquires MR signal data generated by the receiver 9 as a result of execution of various kinds of scanning. Specifically, after receiving MR signal data from the receiver 9, the acquirer 24 performs correction processes, such as an averaging process and a phase correction process, on the MR signal data, and transmits the corrected MR signal data to the data processor 26. The acquirer 24 transmits acquired data for images to the computer system 20. A set of pieces of MR signal data acquired by the acquirer 24 is stored in the storage 25 in the computer system 20 as data mapped in a k-space with the individual pieces of MR signal data two-dimensionally or three-dimensionally arranged in accordance with positional information assigned by the readout gradient magnetic field, the phase-encoding gradient magnetic field, and the slice gradient magnetic field.

The storage 25 stores therein various kinds of data. For example, the storage 25 stores therein MR signal data acquired by the sequence controller 23 and image data generated by the data processor 26 in association with different subjects S. The storage 25 also stores therein various computer programs and various kinds of data that the sequence controller 23, the acquirer 24, the data processor 26, and the system controller 27 use when executing various kinds of processing. For example, the storage 25 is composed of at least one storage device such as a random access memory (RAM), read only memory (ROM), a flash memory, a hard disk, or an optical disc.

The data processor 26 generates an image based on MR signal data acquired by the acquirer 24. Specifically, upon receiving MR signal data from the acquirer 24, the data processor 26 performs post-processing, namely, reconstruction processing such as the Fourier transform, on the received MR signal data to generate an image of the subject S. The data processor 26 then transmits data of the generated image to the computer system 20.

The system controller 7 controls the entirety of the MRI apparatus 100 by controlling the individual elements included in the MRI apparatus 100. For example, the system controller 27 receives from an operator, via the input device 21, input of imaging conditions including imaging parameters related to various imaging methods. The system controller 27 then puts scanning of various kind into execution by generating the sequence execution data based on the received imaging conditions, and transmitting the generated data to the sequence controller 23.

The system controller 27 stores in the storage 25 MR signal data transmitted from the acquirer 24 and data for images transmitted from the data processor 26, ac a result of executing scanning of various kinds. The system controller 27 reads out from the storage 25 an image requested by an operator, and outputs the read-out image to the display 22. Furthermore, for example, the system controller 27 muses the couch 4 to move by controlling the couch controller 5 in accordance with an instruction received via the input device 21 from an operator.

Among the above-described individual elements, at least one of the sequence controller 23, the acquirer 24, the data processor 26, and the system controller 27 is composed of, for example, circuitry such as a processor, such as a central processing unit (CPU) or a micro processing unit (MPU), a memory, an application specific integrated circuit (ASIC), or a field programmable gate array (FPGA). In this case, for example, the memory stores therein computer programs that contain instructions prescribing processing procedures for processing to be performed by the individual units. When being read out and executed by the processor, the computer programs stored in the memory cause the processor to execute the processing to be performed by the individual units.

Although the description herein illustrates an exemplary case in which the sequence controller 23, the acquirer 24, the data processor 26, and the system controller 7 are configured independently from each other, the embodiment is not limited thereto. For example, the configurations of the sequence controller 23, the acquirer 24, the data processor 26, and the system controller 27 may be distributed or integrated as appropriate.

The exemplary configuration of the MRI apparatus 100 according to the first embodiment is as described heretofore. Being configured as above, the MRI apparatus 100 is provided with a configuration adapted to: execute, in a plurality of time phases, data acquisition in which readout gradient magnetic fields of opposite polarities are alternately applied; and generate an image for each time phase, based on acquired echo signals.

Here, an imaging method in which readout gradient magnetic fields of opposite polarities are alternately applied is, for example, the echo planar imaging (EPI) method. In an imaging method in which readout gradient magnetic fields of opposite polarities are thus alternately applied, an artifact may appear in a generated image.

For example, in imaging with a pulse sequence according to the EPI method, echo signals corresponding to even-numbered lines in a k-space and echo signals corresponding to odd-numbered lines therein are alternately acquired while the polarity of the readout gradient magnetic field is alternately reversed. In this imaging according to the EPI method, a phase difference occurs between echo signals corresponding to the even-numbered lines and echo signals corresponding to the odd-numbered lines under the influence of eddy current and non-uniformity of the magnetostatic field, and an artifact may appear in an image as a result of this phase difference.

To prevent such an artifact, the MRI apparatus 100 is provided with a configuration to: execute first data acquisition for a phase correction map; and generate a phase correction map, based on acquired echo signals.

Here, as a method for generating the phase correction map, any one of various known methods can be used. For example, a method is used that includes: applying a phase-encoding gradient magnetic field; alternately acquiring echo signals corresponding to the even-numbered lines and echo signals corresponding to the odd-numbered lines while reversing the polarity of a readout gradient magnetic field; and generating a two-dimensional phase correction map. For example, in this method, an image is generated from echo signals corresponding to the even-numbered lines, another image is generated from echo signals corresponding to the odd-numbered lines, and a phase correction map is generated based on comparison between phases of these respective images. In this method, to prevent wraparound in the phase correction map, echo signals are acquired with the field of view (FOV) set higher than in data acquisition for images. This method allows phase difference corrections in the readout direction and the phase-encoding direction of an image.

However, when acquisition of data for images is executed at a plurality of time phases, phases of echo signals may change with time. For example, an increase in temperature with time may widen the phase difference between echo signals. In such a case, image generated in different time phases come to have different phases, and appropriate correction of all of the images may be impossible with the use of the same phase correction map.

Here, to execute acquisition of data for images at a plurality of time phases means to acquire data at a plurality of different time phases along the time sequence. For example, examples of imaging in which acquisition of data is executed at a plurality of time phases include dynamic imaging and diffusion tensor image (DTI) imaging. For example, in DTI imaging, a pulse sequence according to the EPI method includes applying a plurality of times a motion probing gradient (MPG) for diffusion detection while changing the direction from which the gradient is applied. In DTI imaging, a time taken for imaging tends to be long because the MPG magnetic field may be applied 30 or more times from different directions.

Given this situation, the MRI apparatus 100 is provided with a configuration adapted to, using the phase correction map and based on changes in phase of echo signals that occur between time phases, correct changes in phase between images generated in the respective time phases. With this configuration, changes in phase between images generate in the respective time phases can be corrected based on changes in phase of echo signals that occur between time phases. This configuration thus enables more appropriate image correction regardless of temporal changes in phase of echo signals.

The configuration of the MRI apparatus 100 according to the first embodiment is described next in detail.

The sequence controller 23 executes first data acquisition in which to acquire data for a phase correction map, and second data acquisition in which to acquire data a cluster of images corresponding to a plurality of time phases.

For example, in the second data acquisition, the sequence controller 23 acquires additional echo signals each time when having acquired k-space data corresponding to one time phase.

For example, in the second data acquisition, the sequence controller 23 applies a readout gradient magnetic field and acquires additional echo signals with no phase-encoding gradient magnetic field applied.

For example, when acquiring echo signals with which k-space data is filled while the polarity of the readout gradient magnetic field is reversed, the sequence controller 23 acquires, as additional echo signals, at least two echo signals under different polarities of the readout gradient magnetic field.

For example, the sequence controller 23 executes the first data acquisition for a phase correction map, and executes in a plurality of time phases the second data acquisition in which readout gradient magnetic fields of opposite polarities are alternately applied.

In the first embodiment, the sequence controller executes the first data acquisition at a time point before a plurality of time phases when the second data acquisition is executed.

Figure 2:
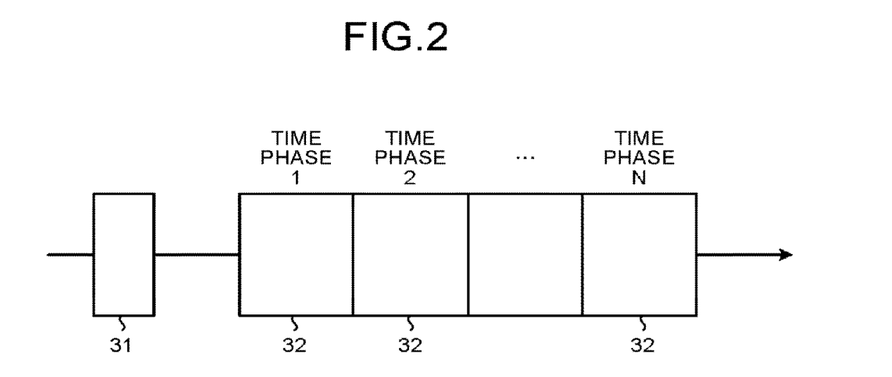
FIG. 2 is a diagram illustrating one example of data acquisition to be executed by a sequence controller according to the first embodiment.

FIG. 2 is a diagram illustrating one example of data acquisition to be executed by the sequence controller 23 according to the first embodiment. For example, as illustrated in FIG. 2, the sequence controller 23 executes first data acquisition 31 for a phase correction map before a plurality of time phases 1 to N. After executing the first data acquisition 31, the sequence controller 23 executes, in the time phases 1 to N, second data acquisition 32 in which readout gradient magnetic fields of opposite polarities are alternately applied.

Here, the sequence controller 23, with respect to at least one echo signal acquired at the beginning of each of the time phases among a plurality of echo signals acquired through the second data acquisition, acquires the echo signal while applying a readout gradient magnetic field with no phase-encoding gradient magnetic field applied.

Figure 3:
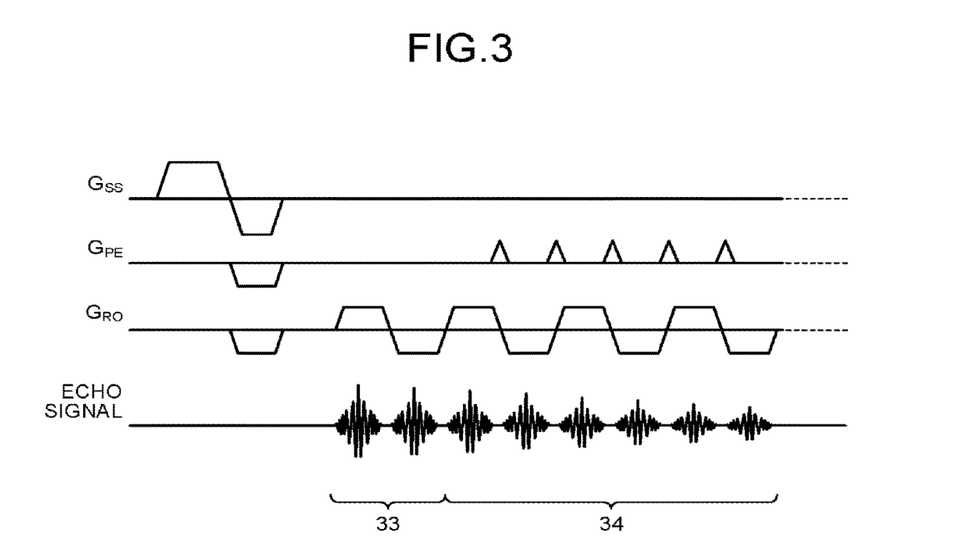
FIG. 3 is a diagram illustrating one example of a pulse sequence to be used in second data acquisition according to the first embodiment.

FIG. 3 is a diagram illustrating one example of a pulse sequence to be used in the second data acquisition 32 according to the first embodiment. In FIG. 3, reference sign $G_{SS}$ indicates a slice gradient magnetic field, reference sine $G_{PE}$ indicates a phase-encoding gradient magnetic field, and $G_{RO}$ indicates a readout gradient magnetic field. The pulse sequence illustrated in FIG. 3 represents a pulse sequence executed at one time phase, and the same pulse sequence is executed at each of the time phases 1 to N.

For example, as illustrated in FIG. 3, with respect two echo signals 33 acquired at the beginning of each of the time phases among a plurality of echo signals acquired through the second data acquisition 32, the sequence controller 23 acquires these echo signals with a readout gradient magnetic field applied and with no phase-encoding gradient magnetic field applied. In this acquisition, for example, the sequence controller 23 acquires the two echo signals 33 while reversing the polarity of the readout gradient magnetic field. The sequence controller 23 acquires the other echo signals 34 while applying a readout gradient magnetic field and a phase-encoding gradient magnetic field. In this acquisition, the sequence controller 23 acquires these echo signals 34 while reversing the readout gradient magnetic field from one polarity to the other.

Figure 4:
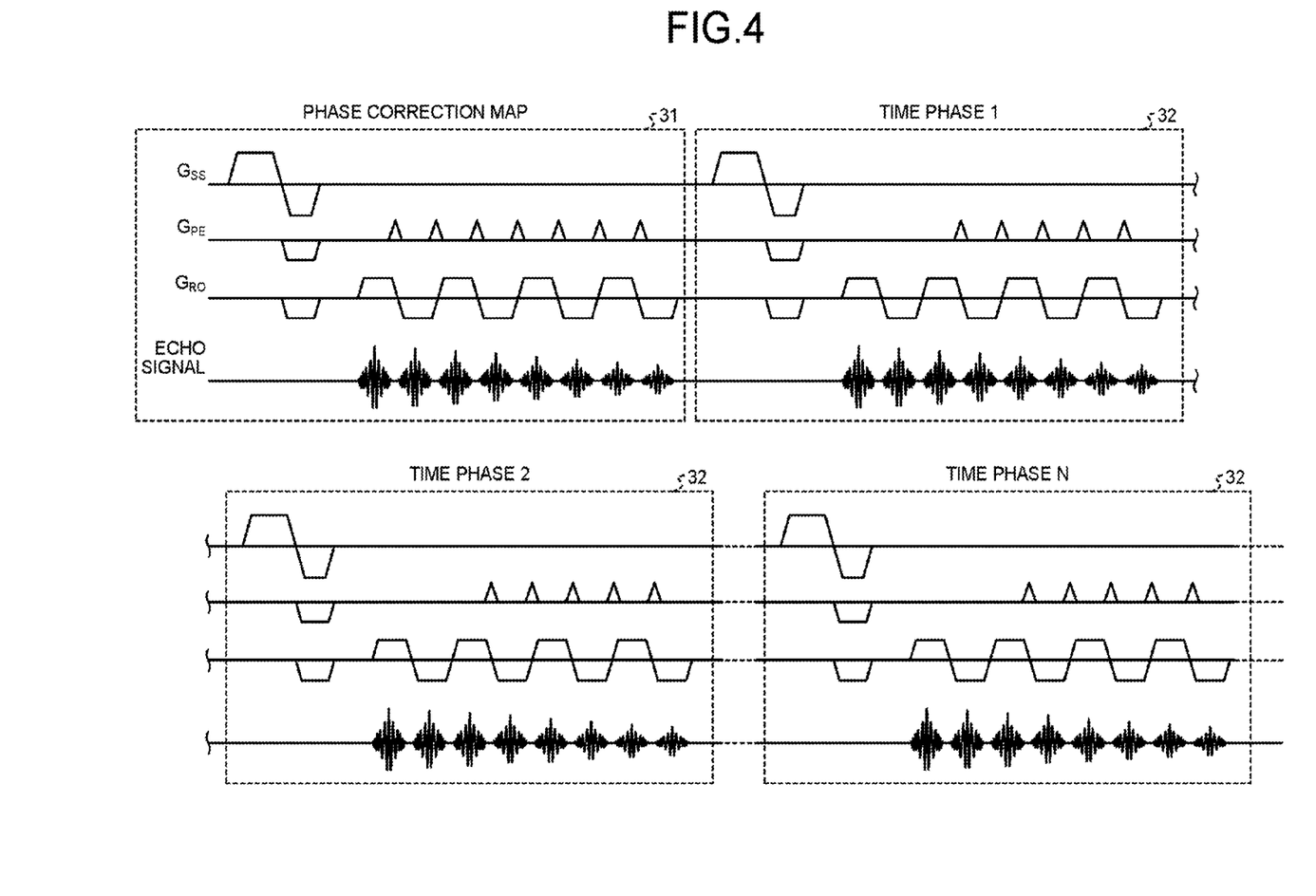
FIG. 4 is a diagram illustrating one example of pulse sequences of data acquisitions to be executed by a sequence controller according to the first embodiment.

FIG. 4 is a diagram illustrating one example of pulse sequences of data acquisitions to be executed by a sequence controller according to the first embodiment. FIG. 4 illustrates a pulse sequence used in the first data acquisition 31 to acquire data for the phase correction map, and pulse sequences used in the second data acquisitions 32 corresponding to a plurality of the time phases 1 to N.

For example, as illustrated in FIG. 4, the sequence controller 23 executes the first data acquisition 31 and the second data acquisitions 32 corresponding to a plurality of the time phases 1 to N by a series of pulse sequences. Specifically, the sequence controller 23 executes the first data acquisition 31 and thereafter, subsequently, successively executes the second data acquisitions 32.

Note that, for the first data acquisition 31 to acquire data for the chase correction map, the pulse sequence illustrated in FIG. 4 is merely one example and various types of pulse sequences according to various types of methods for generating the phase correction map may be used.

Figure 5:
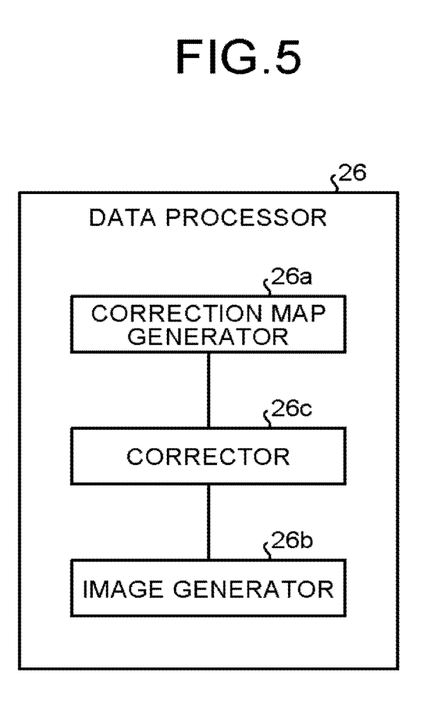
FIG. 5 is a diagram illustrating an exemplary functional configuration of a data processor according to the first embodiment.

FIG. 5 is a diagram illustrating an exemplary configuration of the data processor 26 according to the first embodiment. For example, as illustrated in FIG. 5, the data processor 26 includes a correction map generator 6a, an image generator 26b, and a corrector 26c.

The correction map generator 26a generates a phase correction map by using echo signals acquired through the first data acquisition.

For example, based on echo signals acquired through the first data acquisition, the correction map generator 26a generates the phase correction map. Here, as described above, any one of various known methods can be used as a method for generating a phase correction map.

The image generator 26b generates a cluster of images corresponding to a plurality of time phases by using echo signals acquired through the second data acquisition.

For example, the image generator 26b generates an image with respect to each of the time phases, based on echo signals acquired through the second data acquisition.

In the first embodiment, the image generator 26b generates an image with respect to each of the time phases, based on echo signals acquired through the second data acquisition. For example, the image generator 26b genera an image with respect to each of the time phases 1 to N illustrated in FIG. 2, based on echo signals 34 illustrated in FIG. 3.

The corrector 26c corrects a phase of each image included in a cluster of images corresponding to a plurality of time phases, based on the phase correction map and changes in phase of echo signals that occur between time phases.

For example, the corrector 26c corrects a phase of each image included in a cluster of images corresponding to a plurality of time phases, based on the phase correction map and changes in phase of echo signals that occur between time phases, the changes in phase having been obtained by using echo signals acquired through the second data acquisition.

For example, using additional echo signals acquired in the respective time phases, the corrector 26c obtains changes in phase of echo signals that occur between the time phases.

For example, using the phase correction map and based on changes in phase of echo signals that occur between time phases, the corrector 26c corrects changes in phase between images generated in the respective time phases.

In the first embodiment, the corrector 26c corrects, based on changes in phase of echo signals that occur between time phases, the phase correction map with respect to each time phase, and uses the corrected phase correction map to correct changes in phase between images generated in the respective time phases.

In the first embodiment, based on changes in phase of echo signals each being at least one echo signal acquired at the beginning of each time phase, the corrector 26c also corrects a change in phase in the readout direction in the phase correction map with respect to each time phase.

For example, the corrector 26c calculates, from echo signals in the respective time phases, variations of the zeroth and first phases in the readout direction between the respective time phases, and corrects the phase correction map by using the calculated variations. In this correction, the corrector 26c applies, in the phase correction map, the same variation to positions along the phase-encoding direction that have the same position in the readout direction. Two-dimensional phase corrections in which variations in phase between time phases are reflected can be thus performed.

Note that the corrector 26c, for example, accumulates variations in phase of echo signals with respect to each time phase, and uses the accumulated variations to correct an initially generated phase correction map. Alternatively, the corrector 26c may calculate a variation in phase of echo signals with respect to each time phase, and may use the calculated variation to further correct the phase correction map that has been corrected for the previous time phase.

For example, the corrector 26c, with respect to each time phase, corrects a change in phase in the readout direction in the phase correction map, based on the charge in phase between the two echo signals 33 illustrated in FIG. In this correction, for example, the corrector 26c calculates the phase difference between the two echo signals 33 with respect to each time phase, calculates variations of the phase differences between the individual time phases, and corrects the phase correction map, based on the calculated variations.

The number of echo signals to be used for correcting the phase correction map is not limited to two. For example, the corrector 26c may use one echo signal acquired at the beginning of each time phase to correct the phase correction map. In such a case, the corrector 26c calculates variations in the phase of one echo signal acquired at the beginning of each time phase among the respective time phases, and, based on the calculated variations, corrects the phase correction map.

Echo signals in each time phase to be used for correcting the phase correction map may be signals acquired with readout gradient magnetic fields of the same polarity. In this case, the number of echo signals to be used for correcting the phase correction map may be more than two. In this case, for example, the corrector 26c calculates, with respect to each time phase, the average of echo signals to be used for correction of the phase correction map, and, based on variations of the calculated average among the respective time phases, corrects the phase correction map.

Figure 6:
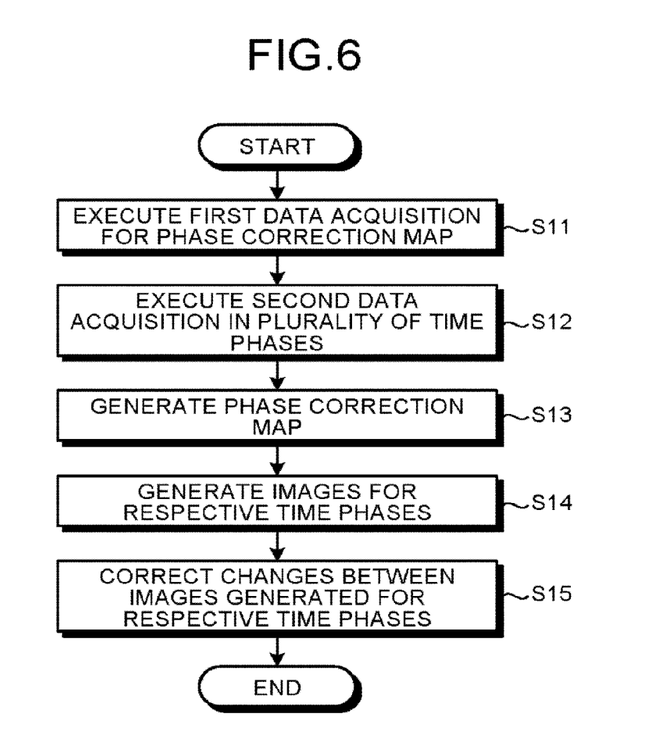
FIG. 6 is a flowchart illustrating a processing procedure for processing to be performed by the MRI apparatus according to the first embodiment.

FIG. 6 is a flowchart illustrating a processing procedure for processing to be performed by the MRI apparatus 100 according to the first embodiment. As illustrated in FIG. 6, in the first embodiment, the sequence controller 23 executes the first data acquisition for a phase correction map in the first place (Step S11). Subsequently, the sequence controller executes, at a plurality of time phases, second data acquisition for an image (Step S12). In the second data acquisition, readout gradient magnetic fields of opposite polarities are alternately applied.

Thereafter, the correction map generator 26a generates a phase correction map, based on echo signals acquired through the first data acquisition (Step S13). After executing the first data acquisition, the correction map generator 26a may generate the phase correction map before or in parallel to the second data acquisition.

Thereafter, the image generator 26b generates an image with respect to each of the time phases, based on echo signals acquired through the second data acquisition (Step S14). Each time the second data acquisition has been executed at each of the time phases, the image generator 26b may generate an image before execution of the second data acquisition at the next time phase or in parallel to the second data acquisition executed at the next time phase. Alternatively, the image generator 26b may generate images for all of the time phases after executing the second data acquisition at all of the time phases.

Thereafter, using the phase correction map and based changes in phase of echo signals between time phases, the corrector 26c corrects changes in phase between images generated in the respective time phases (Step S15). The corrector 26c may correct images each time the image generator 26b has generated an image, or may correct images after the image generator 26b has generated images for all of the time phases.

As described above, in the first embodiment, changes in phase between images generated in the respective time phases are corrected based on changes in phase of echo signals that occur between time phases. The first embodiment thus enables more appropriate image correction regardless of temporal changes in phase of echo signals.

First Modification of First Embodiment

The first embodiment described above illustrates an exemplary case in which the phase correction map is corrected based on the phase of at least one echo signal acquired at the beginning of each time phase among a plurality of echo signals acquired through the second data acquisition. However, embodiments are not limited thereto.

For example, the phase correction map may be corrected based on the center frequency (f0) of echo signals, among a plurality of echo signals acquired through the second data acquisition, that have been acquired during an effective echo time (TE).

In this case, for example, based on changes in center frequency of echo signals, among a plurality of echo signals acquired through the second data acquisition, that have been acquired during an effective TE, the corrector 26c corrects the phase correction map with respect to each time phase. For example, with respect to each time phase, the corrector 26c calculates a shift amount of f0 of echo signals acquired during an effective TE between time phases, and, based on the calculated shift amount of f0, corrects the phase correction map. In this correction, the corrector 26c shifts a phase in the phase correction map by amounts corresponding to the calculated shift amounts of f0.

Second Modification of First Embodiment

Furthermore, the first embodiment described above illustrates an exemplary case in which the phase correction map is corrected based on changes in phase of echo signals acquired with no phase-encoding gradient magnetic field applied. However, embodiments are not limited thereto. For example, the phase correction map may be corrected based on echo signals acquired with a phase-encoding gradient magnetic field applied.

In this case, the sequence controller 23 acquires echo signals in such a manner that, among a plurality of echo signals acquired through the second data acquisition, at least one echo signal that is acquired at the beginning of each time phase is acquired with a readout gradient magnetic field and a phase-encoding gradient magnetic field both applied. Consequently, echo signals for correction purpose are acquired with respect to each phase-encoding line in the k-space. In this acquisition, for example, the sequence controller 23 acquires echo signals from lines the number of which is smaller than the number of phase-encoding lines in the phase correction map. Consequently, a time taken for acquiring echo signals for use in correction can be reduced. For example, the sequence controller 3 acquires one or a plurality of echo signals with a phase-coding amount corresponding to a part of the k-space near the center thereof.

Furthermore, the corrector 6 compares echo signals for correction acquired in the respective time phases with each other when the echo signals correspond to a phase-encoding line at the same position, and calculates variations in phase between adjacent time phases with respect to each line. The corrector 26c then corrects the phase correction map with respect to each corresponding line, based on the variations in phase calculated with respect to each line. In this correction, regarding any line from which echo signals for correction have not been acquired, the corrector 26 derives variations in phase from echo signals corresponding to lines between which the foregoing line is located, and corrects the phase for the corresponding line in the phase correction map. For example, the corrector 26c derives variations in phase regarding a line not subjected to acquisition of echo signals therefrom for correction, by obtaining an intermediate value between phases of echo signals corresponding to lines between which the foregoing line is located, or by applying a certain function expressing the tendency of changes in phase those signal phases.

Second Embodiment

A second embodiment is described next.

The first embodiment described above illustrates an exemplary case in which changes in phase in the readout direction in the phase correction map are corrected based on changes in phase of echo signals acquired with no phase-encoding gradient magnetic field applied. However, embodiments are not limited thereto. For example, chances in phase in the readout direction and in the phase-encoding direction in the phase correction map may be corrected based on echo signals regarding one slice acquired with a readout gradient magnetic field and a phase-encoding gradient magnetic field both applied. An example of this case is described next as the second embodiment.

While the configuration of an MRI apparatus according to the second embodiment is basically the same as the one illustrated in FIG. 1 and FIG. 5, processing to be performed by the sequence controller 23, the correction map generator 26a, the corrector 26c, and the image generator 26b is different.

In the second embodiment, the sequence controller 23 executes the second data acquisition for a plurality of adjacent slices with a readout gradient magnetic field and a phase-encoding gradient magnetic field both applied. In the second embodiment, as in the case of the first embodiment, the sequence controller 23 executes the first data acquisition for a phase correction map at a time point before a plurality of time phases when the second data acquisition is executed.

Figure 7:
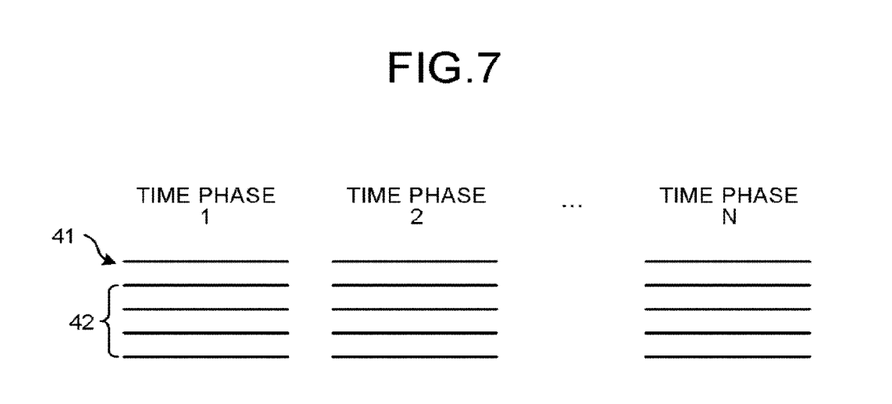
FIG. 7 is a diagram illustrating one example of data acquisition to be executed by a sequence controller according to the second embodiment.

FIG. 7 is a diagram illustrating one example of data acquisition to be executed by the sequence controller 23 according to the second embodiment. For example, as illustrated in FIG. 7, the sequence controller 23 acquires echo signals with respect to each slice of a plurality of adjacent slices in each of the time phases 1 to N. In this acquisition, the sequence controller 23 executes the second data acquisition with respect to each slice with a readout gradient magnetic field and a phase-encoding gradient magnetic field both applied.

For example, as illustrated in FIG. 7, the sequence controller 23 executes the second data acquisition with respect to a slice 41 and a plurality of slices 42 adjacent to the slice 41 in each time phase. Here, for example, the respective slices 42 are set at positions at which imaging to obtain images for diagnosis is performed, and the slice 41 is additionally set for generation of a phase correction map.

In the second embodiment, the correction map generator 26a generates a phase correction map with respect to each time phase, based on echo signals regarding at least one slice of the slices. Here, as described above, any one of various known methods can be used as a method for generating a phase correction map.

Under this condition, in the second embodiment, based on changes in phase in the phase correction maps generated with respect to the respective time phases, the corrector corrects changes in phase in the phase correction maps in the readout direction and in the phase-encoding direction.

For example, the correction map generator 6a generates phase correction maps with respect to the respective time phases 1 to N illustrated in FIG. 7, based on echo signals relating to the slice 41. The corrector 26c calculates variations in phase between time phases with respect to positions along the readout direction and along the phase-encoding direction in each of the phase correction maps generated with respect to the respective time phases, and corrects the phase correction maps based on the calculated variations.

As described above, changes in phase in the readout direction and in the phase-encoding direction in the phase correction maps are corrected in the second embodiment. The second embodiment thus enables more appropriate two-dimensional phase correction of images.

Third Embodiment

A third embodiment is described next.

The first and the second embodiments described above illustrate exemplary cases in which: the first data acquisition is executed at a time point before a plurality of time phases when the second data acquisition is executed; and a phase correction map is corrected with respect to each time phase. However, embodiments are not limited thereto. For example, the first data acquisition may be executed, and phase correction map may be generated, with respect to each time phase. An example of this case is described next as the third embodiment.

While the configuration of an MRI apparatus according to the third embodiment is basically the same as the one illustrated in FIG. 1 and FIG. 5, processing to be performed by the sequence controller 23, the correction map generator 26a, the corrector 26c, and the image generator 26b is different.

In the third embodiment, the sequence controller 23 executes the first data acquisition with respect to each time phase. In the third embodiment, the sequence controller does not execute the first data acquisition for a phase correction map at a time point before a plurality of time phases when the second data acquisition is executed.

Figure 8:
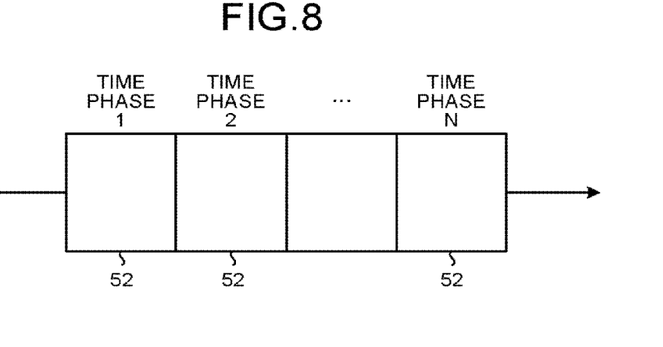
FIG. 8 is a diagram illustrating one example of data acquisition to be executed by a sequence controller according to a third embodiment.

FIG. 8 is a diagram illustrating one example of data acquisition to be executed by the sequence controller 23 according to the third embodiment. For example, as illustrated in FIG. 8, the sequence controller 23 executes, in each of the time phases 1 to N, data acquisition 52 in which the first data acquisition and the second data acquisition are continuously executed. Here, both in the first data acquisition and in the second data acquisition, the sequence controller 23 acquires echo signals with readout gradient magnetic fields of opposite polarities alternately applied, with the readout gradient magnetic fields and a phase-encoding gradient magnetic field both applied.

Figure 9:
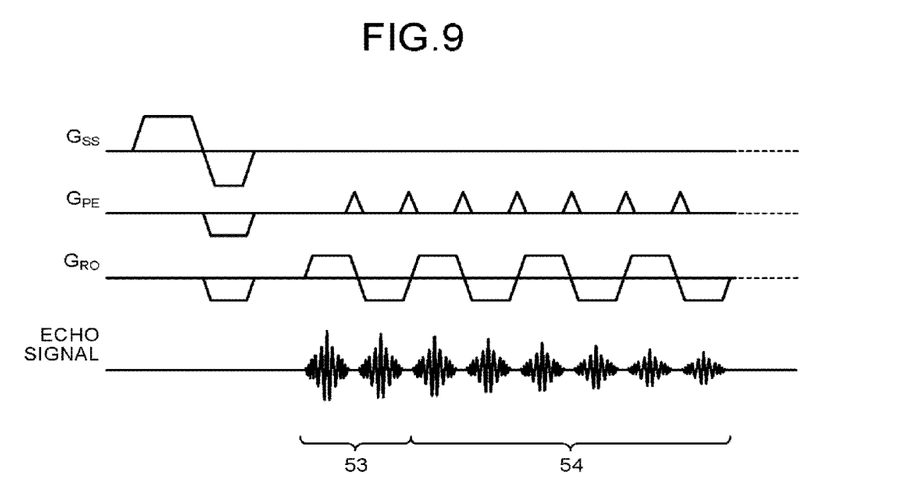
FIG. 9 is a diagram illustrating one example of a pulse sequence to be used in data acquisition according to the third embodiment.

FIG. 9 is a diagram illustrating one example of a pulse sequence to be used in data acquisition 52 according to the third embodiment. In FIG. 9, reference sign $G_{SS}$ indicates a slice gradient magnetic field, reference sine $G_{PE}$ indicates a phase-encoding gradient magnetic field, and $G_{RO}$ indicates a readout gradient magnetic field. The pulse sequence illustrated in FIG. 9 represents a pulse sequence executed at one time phase, and the same pulse sequence is executed at each of the time phases 1 to N.

For example, as illustrated in FIG. 9, the sequence controller 23 acquires a plurality of echo signals 53 through the first data acquisition executed at the beginning of the data acquisition 52. The sequence controller 23 further acquires a plurality of echo signals 54 through the second data acquisition executed, following the first data acquisition, in the data acquisition 52. Here, although the example illustrated in FIG. 9 has only two echo signals 53 for the convenience of illustration, the number of echo signals 53 to be acquired is set to a number that allows the phase correction maps to be generated. For example, the number of echo signals 53 to be acquired is set to at least a number corresponding to eight lines in the k-space.

In the third embodiment, based on echo signals acquired through the first data acquisition, the correction map generator 26a generates a phase correction map with respect to each time phase. Here, as described above, any one of various known methods can be used as a method for generating a phase correction map.

In the third embodiment, the corrector 26c corrects changes in phase between images generated in the respective time phases by using phase correction maps generated for the respective time phases. For example, using a phase correction map generated for each time phase, the corrector 26c corrects an image generated in the same time phase.

As described above, in the third embodiment, phase correction maps are generated for the respective time phases, and images are corrected. The third embodiment thus enables more accurate image correction according to temporal changes in phase of echo signals.

Fourth Embodiment

A fourth embodiment is described next.

The first and the second embodiments described above illustrate exemplary cases in which the first data acquisition is executed at a time point before a plurality of time phases when the second data acquisition is executed. The third embodiment illustrates an exemplary case in which, with respect to each time phase, the first data acquisition is executed and a phase correction map is generated. However, embodiments are not limited thereto. For example, the first data acquisition may be executed, and phase correction maps may be generated, before and after a plurality of time phases when the second data acquisition is executed, respectively. An example of this case is described next as the fourth embodiment.

While the configuration of an MRI apparatus according to the fourth embodiment is basically the same as the one illustrated in FIG. 1 and FIG. 5, processing to be performed by the sequence controller 23, the correction map generator 26a, the corrector 26c, and the image generator 26b is different.

In the fourth embodiment, the sequence controller 23 executes the first data acquisition for phase correction maps at a first time point before the time phases and at a second time point after the time phases, respectively.

Figure 10:
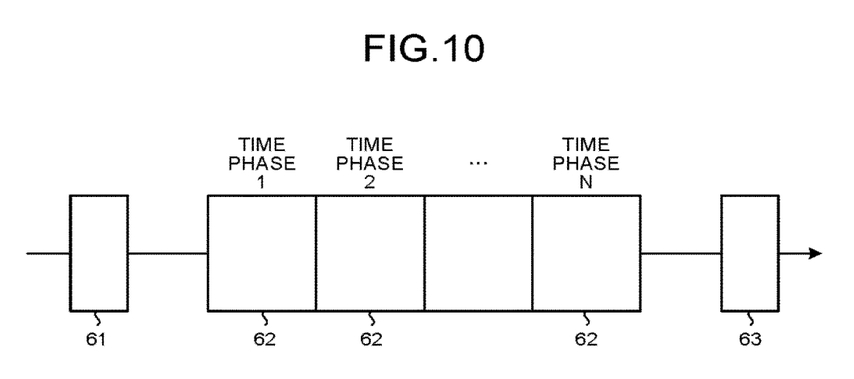
FIG. 10 is a diagram illustrating one example of data acquisition to be executed by a sequence controller according to a fourth embodiment.

FIG. 10 is a diagram illustrating one example of data acquisition to be executed by the sequence control according to the fourth embodiment. For example, as illustrated in FIG. 10, the sequence controller 23 executes first data acquisition 61 for a first phase correction map at a first time point before the time phases 1 to N. After executing the first data acquisition 61, the sequence controller 23 executes, in the time phases 1 to N, second data acquisition 62 in which readout gradient magnetic fields of opposite polarities are alternately applied. The sequence controller 23 then executes second data acquisition 63 for a second phase correction map at a second time point after the time phases 1 to N.

Furthermore, in the fourth embodiment, the correction map generator 26a generates the first phase correction map based on echo signals acquired at the first time point, and generates a second phase correction map based on echo signals acquired at the second time point. Here, so described above, any one of various known methods can be used as a method for generating a phase correction map.

Furthermore, in the fourth embodiment, based on changes in phase between the first phase correction map and the second phase correction map, the corrector 26c corrects changes in phase between images generated in respective time phases.

For example, the corrector 26c calculates a variation in phase between the first phase correction map and the second phase correction map, and calculates variations with respect to the respective time phases while assuming that variations in phase linearly change over a plurality of time phases. The corrector 26c may calculate variations with respect to the respective time phases without assuming that variations in phase linearly change but by applying a certain function expressing changes in variation over time. The corrector 26c corrects the first phase correction map with respect to each time phase, based on the calculated variations in phase for the respective time phases, and corrects the images by using the corrected correction map.

As described above, in the fourth embodiment, data acquisition for phase correction maps is executed before and after a plurality of time phases. A total time taken for imaging can be reduced according to the fourth embodiment, as compared with a case in which echo signals for correction and generation of a phase correction map are acquired with respect to each time phase.

Each of the above-described embodiments illustrates an exemplary case in which an imaging method involving alternate application of readout gradient magnetic fields of opposite polarities is executed as the second data acquisition. However, embodiments are not limited thereto. For example, the phase correction described in each of the embodiment is also similarly applicable to another imaging method that, when being executed in a plurality of time phases, is susceptible to a phase difference occurring between acquired echo signals. Examples of such a method include the fast spin echo (FSE) method.

At least one of the above-described embodiments enables more appropriate image correction regardless of temporal changes in phase of echo signals.

While certain embodiments have been described, these embodiments have been presented by way of example only, and are not intended to limit the scope the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured to:
   execute first data acquisition to acquire first echo signals for a phase correction map;
   execute second data acquisition in each of a plurality of time phases to acquire second echo signals for a plurality of images at the time phases;
   generate the phase correction map by using the first echo signals acquired through the first data acquisition;
   generate an image for each of the plurality of time phases by using the second echo signals acquired through the second data acquisition; and
   based on the phase correction map and changes in phase that occur in the second echo signals between the plurality of time phases, correct a phase of each of the images generated for the plurality of time phases.

2. The magnetic resonance imaging apparatus according to claim 1, wherein the changes in phase are obtained by using the second echo signals acquired through the second data acquisition.

3. The magnetic resonance imaging apparatus according to claim 1, wherein the processing circuitry:
   in the second data acquisition, acquires additional echo signals each time k-space data corresponding to one time phase is acquired; and
   by using the additional echo signals acquired in the respective time phases, obtains the changes in phase that occur in the second echo signals between the plurality of time phases.

4. The magnetic resonance imaging apparatus according to claim 3, wherein, in the second data acquisition, the processing circuitry acquires the additional echo signals with a readout gradient magnetic field applied and with no phase-encoding gradient magnetic field applied.

5. The magnetic resonance imaging apparatus according to claim 3, wherein, when acquiring echo signals to be filled in the k-space data while polarity inversion of a readout gradient magnetic field is caused to occur, the processing circuitry acquires as the additional echo signals at least two echo signals under different polarities of the readout gradient magnetic field.

6. The magnetic resonance imaging apparatus according to claim 1, wherein the processing circuitry:
   executes the first data acquisition at a time point before the time phases; and
   based on the changes in phase that occur in the second echo signals between the plurality of the time phases, corrects the phase correction map with respect to each of the plurality of the time phases, and corrects changes in phase between the images by using the corrected phase correction map.

7. The magnetic resonance imaging apparatus according to claim 6, wherein the processing circuitry:
   acquires echo signals in such a manner that, among the second echo signals acquired through the second data acquisition, at least one echo signal acquired at the beginning of each of the time phases is acquired with readout gradient magnetic field applied and with no phase-encoding gradient magnetic field applied; and
   based on changes in phase of echo signals each being the at least one echo signal, corrects changes in phase of the phase correction map in the readout direction for the respective time phases.

8. The magnetic resonance imaging apparatus according to claim 6, wherein, based on changes in center frequency of echo signals acquired during an effective echo time (TE) among the second echo signals acquired through the second data acquisition, the processing circuitry corrects the phase correction map with respect to each of the time phases.

9. The magnetic resonance imaging apparatus according to claim 6, wherein the processing circuitry:
   executes the second data acquisition for each of a plurality of adjacent slices with a readout gradient magnetic field and a phase-encoding gradient magnetic field both applied;
   based on echo signals regarding at least one slice of the slices, generates a phase correction map for each of the time phases; and
   based on changes in phase in the phase correction map generated with respect to the respective time phases, corrects changes in the phase correction map in phase in the readout direction and in the phase-encoding direction with respect to each of the time phases.

10. The magnetic resonance imaging apparatus according to claim 1, wherein the processing circuitry:
    executes the first data acquisition with respect to each of the time phases;
    based on the first echo signals acquired through the first data acquisition, generates phase correction maps with respect to the respective time phases; and
    by using the phase correction map generated with respect to the respective time phases, corrects the changes in phase between the images.

11. The magnetic resonance imaging apparatus according to claim 1, wherein the processing circuitry:
    executes the first data acquisition at a first time point before the time phases and at a second time point after time phases;
    generates a first phase correction map based on echo signals acquired at the first time point, and generates a second phase correction map based on echo signals acquired at the second time point; and
    based on a change in phase between the first phase correction map and the second phase correction map, corrects changes in phase between the images.

12. A magnetic resonance imaging method comprising:
    executing first data acquisition to acquire first echo signals for a phase correction map;
    executing second data acquisition in each of a plurality of time phases to acquire second echo signals for a plurality of images at time phases;
    generating the phase correction map by using the first echo signals acquired through the first data acquisition;
    generating an image for each of the plurality of time phases by using the second echo signals acquired through the second data acquisition; and
    based on the phase correction map and changes in phase that occur in the second echo signals between the plurality of time phases, correcting a phase of each of the images generated for the plurality of time phases.

13. A magnetic resonance imaging apparatus comprising processing circuitry configured to:
execute first data acquisition to acquire data for a phase correction map, and second data acquisition to acquire data for a cluster of images corresponding to a plurality of time phases;
generate the phase correction map by using at least one echo signal acquired through the first data acquisition;
generate the cluster of images corresponding the time phases by using echo signals acquired through the second data acquisition; and
based on the phase correction map and changes in phase of echo signals that occur between time phases, correct phases of the respective images included in the cluster of images,
wherein the processing circuitry:
executes the first data acquisition at a time point before the time phases; and
based on the changes in phase of echo signals that occur between the time phases, corrects the phase correction map with respect to each of the time phases, and corrects changes in phase between the images by using the corrected phase correction map, and
wherein, based on changes in center frequency of echo signals acquired during an effective echo time (TE) among the echo signals acquired through the second data acquisition, the processing circuitry corrects the phase correction map with respect to each of the time phases.

14. A magnetic resonance imaging apparatus comprising processing circuitry configured to:
execute first data acquisition to acquire data for a phase correction map, and second data acquisition to acquire data for a cluster of images corresponding to a plurality of time phases;
generate the phase correction map by using at least one echo signal acquired through the first data acquisition;
generate the cluster of images corresponding the time phases by using echo signals acquired through the second data acquisition; and
based on the phase correction map and changes in phase of echo signals that occur between time phases, correct phases of the respective images included in the cluster of images,
wherein the processing circuitry:
executes the first data acquisition at a time point before the time phases; and
based on the changes in phase of echo signals that occur between the time phases, corrects the phase correction map with respect to each of the time phases, and corrects changes in phase between the images by using the corrected phase correction map, and
wherein the processing circuitry:
executes the second data acquisition for each of a plurality of adjacent slices with a readout gradient magnetic field and a phase-encoding gradient magnetic field both applied;
based on echo signals regarding at least one slice of the slices, generates a phase correction map for each of the time phases; and
based on changes in phase in the phase correction map generated with respect to the respective time phases, corrects changes in the phase correction map in phase in the readout direction and in the phase-encoding direction with respect to each of the time phases.

* * * * *